United States Patent
Illek et al.

(10) Patent No.: US 7,242,034 B2
(45) Date of Patent: Jul. 10, 2007

(54) METHOD FOR FABRICATING A COMPONENT HAVING AN ELECTRICAL CONTACT REGION, AND COMPONENT HAVING AN ELECTRICAL CONTACT REGION

(75) Inventors: Stefan Illek, Donaustauf (DE); Peter Stauss, Pettendorf (DE); Andreas Ploessl, Regensburg (DE); Gudrun Diepold, Regensburg (DE); Ines Pietzonka, Regensburg (DE); Wilhelm Stein, Donaustauf (DE); Ralph Wirth, Pettendorf-Adlersberg (DE); Walter Wegleiter, Nittendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/770,693

(22) Filed: Feb. 2, 2004

(65) Prior Publication Data
US 2005/0090031 A1    Apr. 28, 2005

(30) Foreign Application Priority Data
Jan. 31, 2003 (DE) ............... 103 03 968
Feb. 26, 2003 (DE) ............... 103 08 322
Jun. 30, 2003 (DE) ............... 103 29 515

(51) Int. Cl.
*H01L 29/22* (2006.01)
(52) U.S. Cl. ............ 257/99; 257/615; 257/741; 257/744
(58) Field of Classification Search ........... 257/615, 257/99, 741, 744
See application file for complete search history.

(56) References Cited

U.S. PATENT DOCUMENTS

| 4,179,534 A | 12/1979 | Chang et al. |
| 4,228,455 A | 10/1980 | Yasuda et al. |
| 4,553,154 A | 11/1985 | Tsujii |
| 5,008,718 A | 4/1991 | Fletcher et al. |

(Continued)

FOREIGN PATENT DOCUMENTS

DE          29 20 444         5/1979

(Continued)

OTHER PUBLICATIONS

Schnitzer et al., "30% external quantum efficiency from surface textured, thin-film light-emitting diodes", Appl. Phys. Lett. vol. 63 (16), pp. 2174-2176, 1993.

(Continued)

*Primary Examiner*—Douglas M. Menz
(74) *Attorney, Agent, or Firm*—Cohen Pontani Lieberman & Pavane LLP

(57) ABSTRACT

A method for fabricating a component having an electrical contact region on an n-conducting AlGaInP-based or AlGaInAs-based outer layer of an epitaxially grown semiconductor layer sequence, in which electrical contact material, which includes Au and at least one dopant, is applied and the outer layer is then annealed. The dopant contains at least one element selected from the group consisting of Ge, Si, Sn and Te. Also, a component is disclosed which includes an epitaxially grown semiconductor layer sequence with an active zone which emits electromagnetic radiation, the semiconductor layer sequence having an n-conducting AlGaInP-based or AlGaInAs-based outer layer, to which an electrical contact region is applied using the method described.

19 Claims, 3 Drawing Sheets

U.S. PATENT DOCUMENTS

| | | | |
|---|---|---|---|
| 5,250,466 A | 10/1993 | Gerner et al. | |
| 5,731,224 A * | 3/1998 | Gerner | 438/605 |
| 6,222,207 B1 | 4/2001 | Carter-Coman et al. | |
| 2004/0026701 A1 | 2/2004 | Murai et al. | |

FOREIGN PATENT DOCUMENTS

| | | |
|---|---|---|
| DE | 32 00 788 A1 | 7/1982 |
| DE | 41 13 969 A1 | 4/1991 |
| EP | 1 179 836 A2 | 8/2001 |
| EP | 1 424 726 A1 | 6/2004 |
| JP | 10-209500 | 8/1998 |

OTHER PUBLICATIONS

Kish F.A., et al., "Very high-efficiency semiconductor wafer-bonded transparent substrate $(Al_xGa_{1-x})_{0.5}In_{0.5}P/GaP$ light emitting diodes", Appl. Phys. Lett. vol. 64(21), pp. 2839-2841, 1994.

* cited by examiner

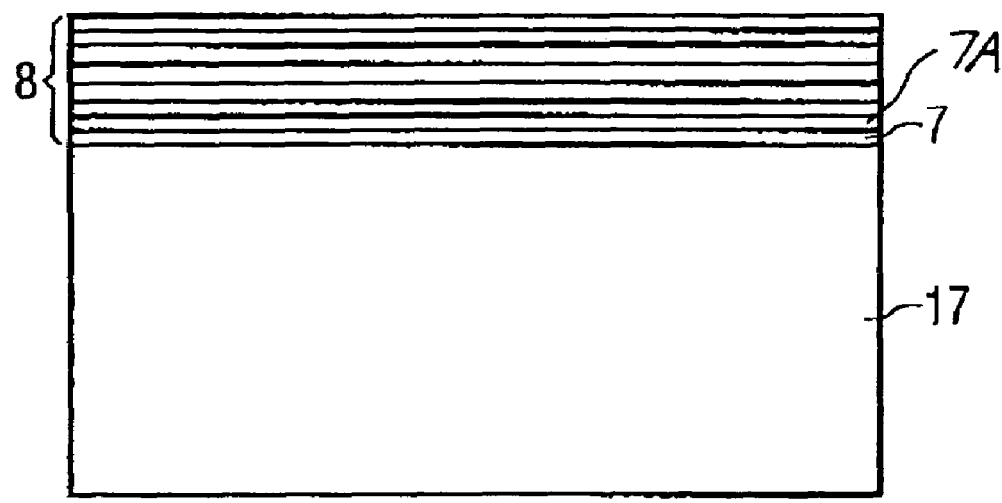
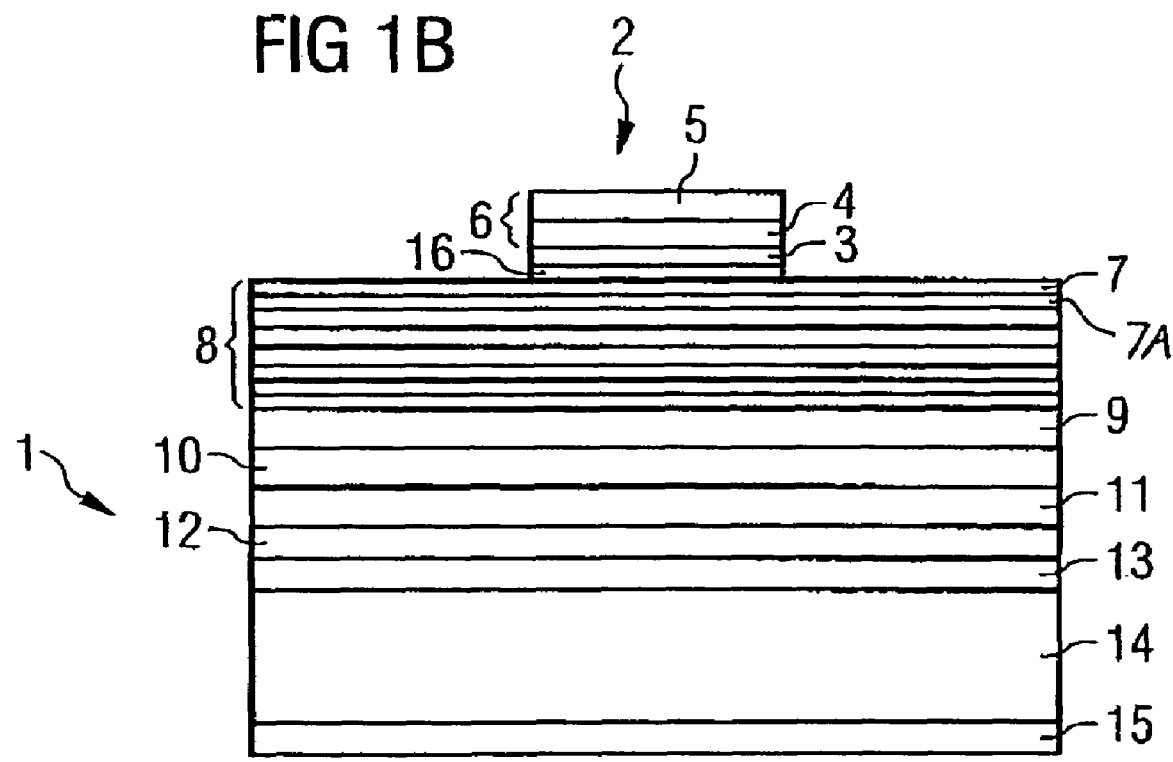

METHOD FOR FABRICATING A COMPONENT HAVING AN ELECTRICAL CONTACT REGION, AND COMPONENT HAVING AN ELECTRICAL CONTACT REGION

RELATED APPLICATIONS

The present patent application claims the priority of German patent applications 10303968.6, 10308322.7 and 10329515.1, the content of disclosure of which is hereby incorporated by reference.

FIELD OF THE INVENTION

The invention relates to a method for fabricating a component having an electrical contact region which is arranged on an outer layer of an epitaxially grown semiconductor layer sequence. Furthermore, the invention relates to a component which includes such an epitaxial semiconductor layer sequence with an active zone which emits electromagnetic radiation, the semiconductor layer sequence including the outer layer, to which an electrical contact region is applied. The outer layer is based in particular on AlGaInP or AlGaInAs.

BACKGROUND OF THE INVENTION

An AlGaInP-based or AlGaInAs-based layer is to be understood as meaning a layer which comprises at least one material $Al_xGa_yIn_{1-x-y}P$ or $Al_xGa_yIn_{1-x-y}As$, where $0 \leq x \leq 1$, $0 \leq y \leq 1$ and $x+y \leq 1$. This material does not necessarily have to have a composition which mathematically precisely corresponds to the above formula. Rather, it may include one or more dopants and additional constituents which substantially do not change the physical properties of the material. For the sake of simplicity, however, the above formula includes only the main constituents of the crystal lattice (Al, Ga, In and P or As), even if these constituents may be partially replaced by small quantities of further substances.

In commercial semiconductor components based on AlGaInP or AlGaInAs, the front surface, i.e. that side of a semiconductor layer sequence which is remote from a growth substrate, is generally doped in such a manner as to be p-conducting. The reason for this is in particular the fact that commercial GaAs substrates of the required quality are only available as n-doped substrates, to which initially an n-doped epitaxial semiconductor structure is applied. For this reason, electrical contact regions for AlGaInP-based semiconductor layer sequences have hitherto been produced almost exclusively on p-doped layers.

In the text which follows, the term outer layer or external semiconductor layer is to be understood as meaning a semiconductor layer of a semiconductor layer sequence which is not followed by any further semiconductor layers, at least in partial regions, on one of two main surfaces. In particular, it is a semiconductor layer of an epitaxially grown semiconductor layer sequence which is not followed by any further semiconductor layers, at least in partial regions, on one side.

External n-conducting AlGaInP-based or AlGaInAs-based semiconductor layers with which electrical contact is to be made are found, for example, in thin-film light-emitting diodes. During fabrication thereof, the epitaxial semiconductor layer sequence is ended with a p-conducting layer, as is generally customary. Then, a carrier substrate is applied to the final p-conducting layer and the growth substrate is at least partially removed from the semiconductor layer, so that an n-conducting semiconductor layer, with which the growth was commenced, is exposed.

A further possible way of obtaining n-conducting external semiconductor layers with which electrical contact is to be made, if the growth is ended with a p-conducting layer, is for p-conducting layers to be removed at at least one location until part of an n-conducting layer with which contact is to be made is uncovered. In this way it is possible, for example in the case of a light-emitting diode, to produce both electrical contact regions on one side.

Furthermore, it is also conceivable to use technologies in which the first layer formed during growth of an epitaxial AlGaInP-based or AlGaInAs-based semiconductor layer sequence is a p-conducting layer, and the final layer is an n-conducting layer, so that an n-conducting semiconductor layer is on the outside from the outset.

To produce electrical contact region to an n-conducting AlGaInP-based or AlGaInAs-based semiconductor layer, it is possible to produce an electrically conductive contact to a GaP intermediate substrate, for example by means of direct wafer bonding, and for an electrical connection contact then to be applied to this electrically conductive contact (cf. for example F. A. Kish, F. M. Steranka et al., "Very high-efficiency semiconductor wafer-bonded transparent substrate $(Al_xGa_{1-x})_{0.5}In_{0.5}P$/GaP light emitting diodes", 1994, Appl. Phys. Lett. 64(21): 2839–2841). The technology used to produce an electrical connection contact which is applied direct to an n-conducting semiconductor layer of this nature, by contrast, is not yet sufficiently evolved. At the same time, there is an increasing demand for ways of producing electrical contact regions of this nature.

SUMMARY OF THE INVENTION

One object of the present invention is to provide a method which allows an electrical contact region to be produced directly on an n-conducting AlGaInP-based or AlGaInAs-based semiconductor layer.

Another object of the present invention is to provide a component having an epitaxial semiconductor layer sequence with an active zone which emits electromagnetic radiation, this component having an electrical contact region produced directly on an n-conducting AlGaInP-based or AlGaInAs-based semiconductor layer.

These and other objects are attained in accordance with one aspect of the present invention directed to a method for fabricating a component, having an electrical contact region, that includes the step of providing an epitaxially grown semiconductor layer sequence which comprises an at least partially exposed n-conducting AlGaInP-based or AlGaInAs-based outer layer and an active zone which emits electromagnetic radiation. An electrical contact material, which includes Au and at least one dopant, is applied to the outer layer, the dopant containing at least one element selected from the group consisting of Ge, Si, Sn and Te. The outer layer is then annealed.

More specifically, the annealing causes dopant to diffuse out of the electrical contact material into the outer layer, with the result that the latter is very strongly n-doped in the region adjacent to the electrical contact material. As a result, a potential barrier between the AlGaInP-based or AlGaInAs-based outer layer and the electrical contact material becomes so narrow that an ohmic electrical contact is effectively created. In this context, the term dopant therefore relates to the corresponding substance in the electrical contact material which, however, only performs the true function of a dopant after it has diffused into the outer layer, in particular during the annealing step.

The application of an electrical contact structure direct to the n-conducting outer layer results in a significantly simplified method compared to the fabrication of an electrical contact region via an intermediate substrate. The present method makes it possible, for example, to achieve a simple layer structure, so that both fabrication costs and fabrication time can be saved.

The outer layer is particularly preferably based on a quaternary semiconductor material, i.e. it includes at least Al, Ga, In and P or at least Al, Ga, In and As. Quaternary epitaxial layers are usually avoided as outer layers with which electrical contact is to be made; at least ternary materials or GaAs are often deliberately applied as the outer layer. However, the invention makes it possible in particular to use a material which is based on a quaternary semiconductor material for the outer layer. As a result, an epitaxy process used for production of the semiconductor layer sequence can be simplified, for example by virtue of the fact that growth of an additional binary or ternary epitaxy layer as an outer layer above a quaternary semiconductor material is no longer required.

The proportion of dopants in the electrical contact material is particularly advantageously between 0 and 5 percent by weight, inclusive of the upper limit, preferably between 0 and 3 percent by weight, inclusive of the upper limit, particularly preferably between 0.1 and 1.5 percent by weight inclusive.

Au and dopants may be present together in the form of an alloy, which represents one possible embodiment.

Alternatively, the electrical contact material may also be composed of a plurality of layers of material, at least one of which substantially consists of Au and at least another of which substantially consists of at least one of the dopants.

It is likewise particularly advantageous for the electrical contact material to include at least one alloy containing Au and at least one of the dopants, in which the ratio of Au to dopant approximately corresponds to the eutectic composition of the alloy. In the case of Au—Ge, the alloy contains approximately 12 percent by weight of Ge, in the case of Au—Si the alloy contains approximately 3 percent by weight of Si, in the case of Au—Sn the alloy contains approximately 20 percent by weight of Sn, and in the case of Au—Te the alloy contains approximately 42 percent by weight of Te. Eutectic compositions have a lower melting point, and consequently an electrical contact material of this nature can expediently be selected, for example, if it is intended for the annealing and the soldering of the chip to a bonding wire to be carried out simultaneously or if simple removal of the electrical contact material is desired.

Before or after the annealing of the outer layer, it is preferable to apply an electrical connection material in such a manner that it is in contact with the electrical contact material. The contact should be of a nature which is such that there is electrical contact between the electrical connection material and electrical contact material after all the method steps have been carried out.

As seen from the outer layer, the electrical connection material advantageously includes at least a first layer and a second layer, the first layer forming a diffusion barrier and the second layer forming an electrical connection surface.

In this case, the first layer preferably includes at least one of the substances Ti, Pt, TiPt, TiW, TiN and TiW:N, and the second layer includes at least one of the substances Al, Ti, Pt and Au. In this context, it is also possible for the first layer to include a plurality of sublayers of this type.

In the method, it is particularly preferable for at least one surface on the n-conducting outer layer which is intended for the electrical contact region to be cleaned before the electrical contact material is applied. This measure makes it possible to significantly improve the reproducibility of the electrical contact regions in terms of their conductivity, which is a requirement for effective use of the method according to the invention in series production.

Before the electrical contact material is applied, it is particularly advantageous to apply a layer which includes at least one of the substances Ti, Cr, V and Ni and has a thickness of between 0.1 nm and 100 nm, preferably between 1 and 20 nm, in each case inclusive of the limit figures. Underlaying the electrical contact material with substances of this nature reduces the lowest annealing temperature at which an electrical contact region with a sufficiently good conductivity can still be formed. In addition, this improves the bonding between the electrical contact material and the outer layer.

The electrical contact region is preferably produced by, in one step, first of all applying a mask layer to the outer layer, and by windows being formed in the mask layer at the locations at which electrical contact regions are intended to be formed. After the electrical connection material has been applied, the electrical contact material and the electrical connection material which are present on the mask layer is lifted off by removal of the mask layer. A method of this type makes it possible to produce the electrical contact region using just one lithography process, even if this region includes a plurality of layers.

In a particularly preferred embodiment of the method according to the invention, the outer layer is doped with at least one of the substances Te, Si, Se, S, Ge and Sn, in a concentration which is greater than or equal to $5 \cdot 10^{17}$ cm$^{-3}$ and is preferably in the range from greater than or equal to $8 \cdot 10^{17}$ cm$^{-3}$ to less than or equal to $5 \cdot 10^{19}$ cm$^{-3}$.

The outer layer is advantageously part of an epitaxial semiconductor layer sequence which is grown onto a growth substrate, starting with the n-conducting outer layer. The outer layer is uncovered by the front surface of the semiconductor layer sequence being applied to the carrier substrate and then the growth substrate and any intermediate layers between the growth substrate and the epitaxial semiconductor layer sequence being removed. In the present context, the term front surface means that side of the semiconductor layer sequence which is remote from the growth substrate. In this embodiment of the method, the carrier substrate can be made significantly thinner than the growth substrate.

An epitaxial semiconductor layer sequence of this type is preferably a light-emitting diode layer sequence, in particular for a thin-film light-emitting diode.

Another aspect of the present invention is directed to a thin-film light-emitting diode chip having a reflective layer that is applied or formed on a first main surface, facing toward a carrier element, of a radiation-generating epitaxy layer sequence. This reflective layer reflects at least some of the electromagnetic radiation which is generated in the epitaxy layer sequence back into this layer sequence. The epitaxy layer sequence has a thickness in the range of 20 µm or below, in particular in the region of 10 µm. The epitaxy layer sequence includes at least one semiconductor layer having at least one surface which has a mixing structure, which ideally leads to an approximately ergodic distribution of light in the epitaxial epitaxy layer sequence, i.e. as far as possible it has an ergodically stochastic scattering behavior.

A basic principle of a thin-film light-emitting diode chip is described, for example, in I. Schnitzer et al., Appl. Phys. Lett. 63 (16), Oct. 18, 1993, 2174–2176, the content of disclosure of which in this respect is hereby incorporated by reference.

Prior to the annealing step, a solder layer is expediently formed between the carrier substrate and the epitaxial semiconductor layer sequence. This is followed by annealing at a temperature at which the solder layer substantially does not melt.

In a particularly advantageous embodiment of the method, an electrical back-surface contact is applied to that surface of the carrier substrate which is remote from the epitaxial semiconductor layer sequence prior to the annealing step. Consequently, both the electrical contact region and the back-surface contact can be annealed simultaneously by means of just one tempering operation.

The carrier substrate expediently includes a semiconductor material, in particular GaAs or Ge, and the back-surface contact preferably includes Au and at least one of the substances Ge, Zn and Be.

In an advantageous embodiment of the method, the outer layer at least partially includes Al and Ga in a ratio a:(1-a), where $0.4 \leq a \leq 1$.

In the case of components which are based on phosphide compound semiconductors and have outer layers which are doped to be p-conducting, these outer layers usually have an Al content which is as low as possible, since the electrical contact-making properties deteriorate as the Al content rises. In the case of outer layers which are doped to be n-conducting in components based on phosphide compound semiconductors, on the other hand, the surprising discovery has been made that the contact-making properties of the outer layer, beyond a certain Al content, initially improve as the Al content increases, before reaching a maximum and then deteriorate again as the Al content increases further.

Moreover, it was unexpectedly concluded that, in the case of components which emit electromagnetic radiation, the radiation yield of the component improves as the Al content increases from approximately the same Al content in the outer layer from which an improvement in the contact-making properties could be observed.

Accordingly both the electrical contact-making properties of the AlGaInP-based or AlGaInAs-based layer and the radiation yield of a component can be significantly improved by means of the Al content or by means of the ratio of Al to Ga in the outer layer. Depending on whether, for example, the contact-making properties of the outer layer or the radiation yield are more important, it is possible, in the context of the invention, given a ratio a: (1-a) of Al to Ga in the outer layer, for a value a which is only just above 0.4 or a value which is well above 0.4 to be particularly advantageous.

In one embodiment of the method, a is advantageously greater than or equal to 0.45. In a further embodiment, a is advantageously greater than or equal to 0.5.

The value for a is preferably at most 0.65. Alternatively, a is preferably at most 0.6.

The semiconductor layer sequence advantageously includes a current expansion layer which is well known to a person with ordinary skill in semiconductor technology, as well as the manufacturing of it. It is a layer that helps to spread the electrical current in a diode, such that this current is ideally flowing through the whole active region of a diode. Thus, it is important for a current expansion layer to have a relatively low resistivity. The current expansion layer is arranged between the outer layer and the active zone. In FIG. 1A, the layer 7A adjacent to and above the outer layer 7 could typically be a current expansion layer.

The current expansion layer at least partially includes Al and Ga in a ratio b: (1-b), where $0.4 \leq b \leq 1$. In a similar way to that which has been described in connection with the outer layer, an Al content of this nature or a Al to Ga ratio of this nature in the current expansion layer may have advantageous effects on properties of the component.

In two advantageous embodiments, values of at least 0.45 and of at least 0.5 are specified for the parameter b.

The ratio of Al to Ga preferably substantially corresponds, at least in parts of the current expansion layer, to a ratio of Al to Ga in parts of the outer layer. This makes it possible, for example, to simplify the epitaxy used to grow the current expansion layer and the outer layer.

A component according to the invention includes an epitaxial semiconductor layer sequence with an active zone which emits electromagnetic radiation, the semiconductor layer sequence including an n-conducting AlGaInP-based or AlGaInAs-based outer layer, to which an electrical contact region is applied. The electrical contact region comprises electrical contact material, which includes Au and at least one dopant, the dopant containing at least one element selected from the group consisting of Ge, Si, Sn and Te. The outer layer is particularly preferably based on a quaternary semiconductor material.

The electrical contact region preferably includes electrical connection material.

The proportion of dopants in the electrical contact material is particularly advantageously between 0 and 5 percent by weight, inclusive of the upper limit, preferably between 0 and 3 percent by weight, inclusive of the upper limit, particularly preferably between 0.1 and 1.5 percent by weight inclusive.

The electrical connection material, as seen from the outer layer, advantageously includes at least a first layer and a second layer, the first layer forming a diffusion barrier and the second layer forming an electrical connection surface.

In this case, the first layer preferably includes at least one of the substances Ti, Pt, TiPt, TiW, TiN and TiW:N, and the second layer preferably includes at least one of the substances Al and Au. In this context, it is also possible for the first layer to include a plurality of sublayers of this nature.

The electrical contact material is advantageously underlayed with a layer which includes at least one of the substances Ti, Cr, V and Ni and has a thickness of between 0.1 and 100 nm, preferably between 1 and 20 nm, in each case inclusive of the limit figures. The underlaying of the electrical contact material with substances of this nature inter alia improves the bonding between the electrical contact material and outer layer.

In a particularly preferred embodiment of the component according to the invention, the outer layer is doped with at least one of the substances Te, Si, Se, S, Ge and Sn, in a concentration which is greater than or equal to $5 \cdot 10^{17}$ cm$^{-3}$ and is preferably in the range from greater than or equal to $8 \cdot 10^{17}$ cm$^{-3}$ to less than or equal to $5 \cdot 10^{19}$ cm$^{-3}$.

The epitaxial semiconductor layer sequence of the component is preferably a light-emitting diode layer sequence, in particular a thin-film light-emitting diode.

In an advantageous embodiment of the component, the outer layer, at least in part, includes Al and Ga in a ratio a:(1-a), where $0.4 \leq a \leq 1$.

In one embodiment of the component, a is particularly advantageously greater than or equal to 0.45. In a further embodiment, a is particularly advantageously greater than or equal to 0.5.

The value for a is preferably at most 0.65. Alternatively, a is preferably at most 0.6.

The semiconductor layer sequence advantageously includes a current expansion layer which is arranged between the outer layer and the active zone and, at least in part, includes Al and Ga in a ratio b:(1-b), where $0.4 \leq b \leq 1$. In a similar way to that which has been described in connection with the outer layer, an Al content of this nature or a ratio of Al to Ga of this nature in the current expansion layer may have advantageous effects on properties of the component.

In two advantageous embodiments of the component, values of at least 0.45 and of at least 0.5 are provided for the parameter b.

The ratio of Al to Ga preferably, at least in parts of the current expansion layer, substantially corresponds to a ratio of Al to Ga in parts of the outer layer. This makes it possible, for example, to simplify the epitaxy used to grow the current expansion layer and the outer layer.

BRIEF DESCRIPTION OF THE DRAWINGS

Further advantages and preferred embodiments will emerge from the two exemplary embodiments which are described below in connection with FIGS. 1A to 2E, in which:

FIGS. 1A and 1B diagrammatically depict various method stages of a first exemplary embodiment of the method according to the invention, FIGS. 2A to 2E diagrammatically depict various method stages of a second exemplary embodiment of the method, and FIG. 3 diagrammatically depicts the radiation yield of components which emit electromagnetic radiation, with different values for a, as a function of a.

DETAILED DESCRIPTION OF THE DRAWINGS

Figure 2A:
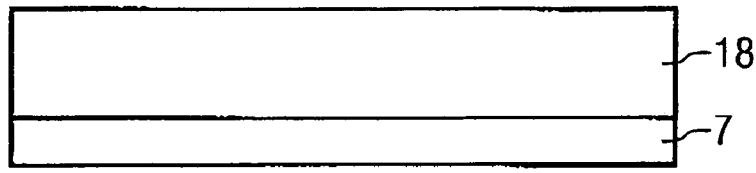
Figure 2B:
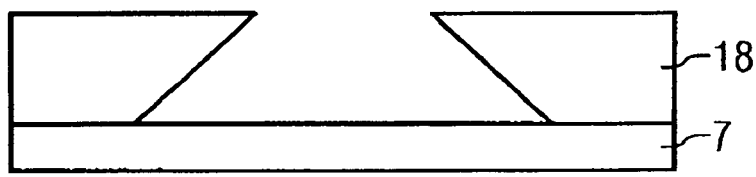

FIG. 1A shows an epitaxial semiconductor layer sequence 8 which has been grown onto a growth substrate 17. This layer sequence is grown starting with an n-conducting AlGaInP-based or AlGaInAs-based outer layer 7 and includes an active zone (not shown) which emits electromagnetic radiation. The outer layer 7 includes at least one material of the composition $Al_xGa_yIn_{1-x-y}P$ or $Al_xGa_yIn_{1-x-y}As$, where $0 \leq x \leq 1$, $0 \leq y \leq 1$ and $x+y \leq 1$. By way of example, it consists of $(Al_aGa_{1-a})_{0.5}In_{0.5}P$, where a is, for example, 0.55. This value for a results in good electrical contact-making with the outer layer 4 by means of an electrical contact region 2.

The active zone includes, for example, a radiation-generating pn junction or a radiation-generating single or multiple quantum structure. Structures of this nature are known to the person skilled in the art and are therefore not described in more detail.

The growth substrate 17 may, for example, consist of n-doped GaAs.

In FIG. 1B, the front surface, i.e. the side remote from the growth substrate 17, of the epitaxial semiconductor layer sequence 8 has been applied to a carrier substrate 14 and the growth substrate 17 has been removed from the epitaxial semiconductor layer sequence 8. An electrical contact region 2 is produced on the uncovered outer layer 7. This electrical contact region includes an approximately 10 nm thick Ti layer 16, a contact layer 3 made from Au:Ge containing approximately 1 percent by weight of Ge, and connection material 6. The connection material 6 comprises a barrier layer 4, which consists of nitrogen-doped TiW, and a connection layer 5 made from aluminum. These different material layers of the electrical contact region 2 can each be applied, for example, by lithography using mask layers and evaporation coating. The surface of the connection layer 5 is suitable for connection of a bonding wire.

Alternatively, the connection layer 5 may comprise a layer sequence having for example a 100 nm thick Ti layer, a 100 nm Pt layer and a 1000 nm Au layer. In the case of a connection layer 5 of this type, the thickness of the contact layer 3 is advantageously between 10 and 300 nm inclusive, for example is approximately 200 nm. Compared to significantly thicker contact layers, this can result in an improved electrically conductive contact or a lower voltage drop at this contact. This also results in a reduced consumption of material, a shorter process time for the deposition of the contact layer 3 and improved patterning properties of the contact layer.

As a further alternative, the contact layer 3 may comprise two sublayers, one of which may, for example, be a 10 nm thick Ge layer and the other of which may, for example, be a 200 nm thick Au layer. In this case, both sequences are possible. It is also possible to use a contact layer which consists of an alloy comprising, for example, 88 percent by weight of Au and 12 percent by weight of Ge, which represents the eutectic composition for these materials.

The epitaxial semiconductor layer sequence 8 is joined to the carrier substrate 14 by means of a solder layer 11. As seen from the solder layer 11, a barrier layer 10 and an AuZn layer 9 are applied between the solder layer 11 and the epitaxial semiconductor layer sequence 8. As seen from the solder layer, a further barrier layer 12 and an electrical intermediate contact 13 are applied between the solder layer 11 and the carrier substrate 14. An electrical back-surface contact 15 is applied to that surface of the carrier substrate 14 which is remote from the epitaxial semiconductor layer sequence 8.

The carrier substrate 14 may, for example, consist of GaAs, while the intermediate contact 13 and the back-surface contact 15 may, for example, consist of Au:Ge, and the solder layer 11 is made, for example, from AuSn.

The outer layer 7 is doped with tellurium in a concentration of approximately $1 \cdot 10^{19}$ cm$^{-3}$. It is cleaned before the electrical contact region 2 is applied, for example using highly dilute HCl, cold phosphoric acid or a solution which contains hydrofluoric acid.

The thin-film light-emitting diode chip 1 is then annealed, so that Ge can diffuse out of the contact layer 3 of the electrical contact region 2, out of the intermediate contact 13 and the back-surface contact 15 into the respectively adjacent semiconductor layer, so that in each case an electrical contact of good conductivity which is virtually ohmic is formed. The annealing is carried out for sufficient time and at a temperature at which the solder layer 11 substantially does not melt, which otherwise could lead to disadvantageous deformation of the solder layer as it solidifies again and could therefore have an adverse effect on the properties of the thin-film light-emitting diode chip.

The application of the Ti layer 16 leads to a lower minimum temperature at which a sufficiently good electrical contact is formed during the annealing step. This may be particularly advantageous for the method, in particular in connection with the possible method step of annealing at a temperature at which the solder layer 11 substantially does not melt.

FIGS. 2A to 2E show an n-conducting AlGaInP-based or AlGaInAs-based outer layer 7, to which an electrical contact region 2 is applied by means of a lift-off technique. For this purpose, first of all a mask layer 18 is applied, as shown in FIG. 2A. A window is formed in the mask layer 18 in such a manner that the surfaces of the mask layer 18 which adjoin the window include an acute angle with the surface of the outer layer 7, so that the window has a larger cross section on its side facing the outer layer 7 than on its opposite side (cf. FIG. 2B).

Figure 2C:
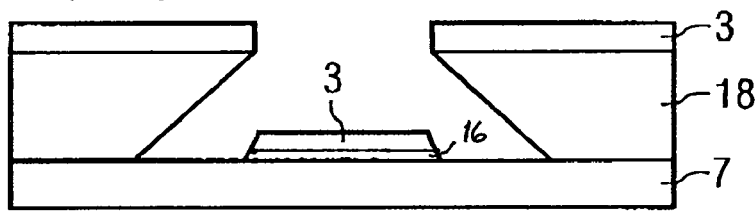
Figure 2D:
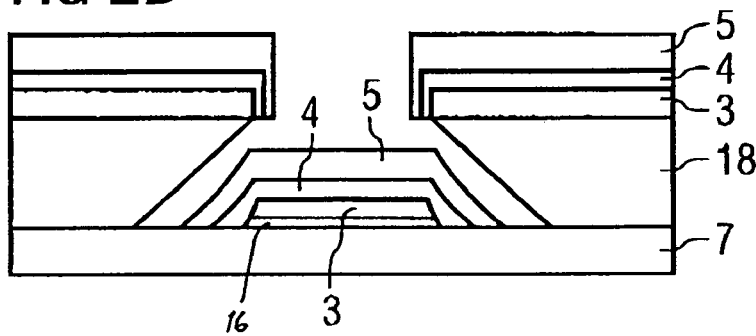
Figure 2E:
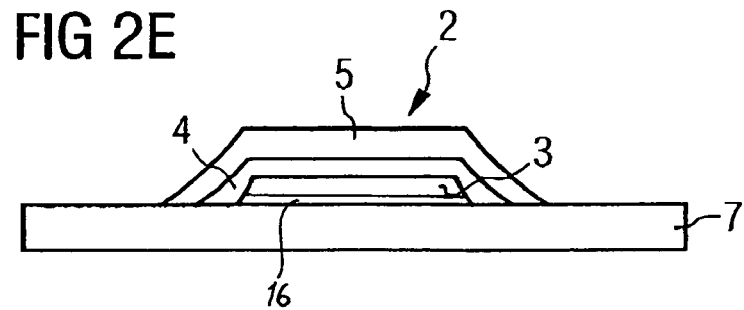

In FIG. 2C, a contact layer 3 has been applied by means of a directional deposition process. Then, a barrier layer 4 and a connection layer 5 are applied by means of a non-directional deposition (e.g. sputtering), as shown in FIG. 2D. At this point, it should be pointed out that the connection layer may in principle also be produced using directional deposition (e.g. evaporation). The mask layer 18 can then be removed by means of a solvent, so that the material located thereon can be lifted off. A suitable material for the mask layer 18 and a suitable solvent for dissolving it are known to the person skilled in the art and need not be specifically indicated here. All that remains, as shown in FIG. 2E, is the electrical contact region 2, which can then be annealed.

Figure 3:
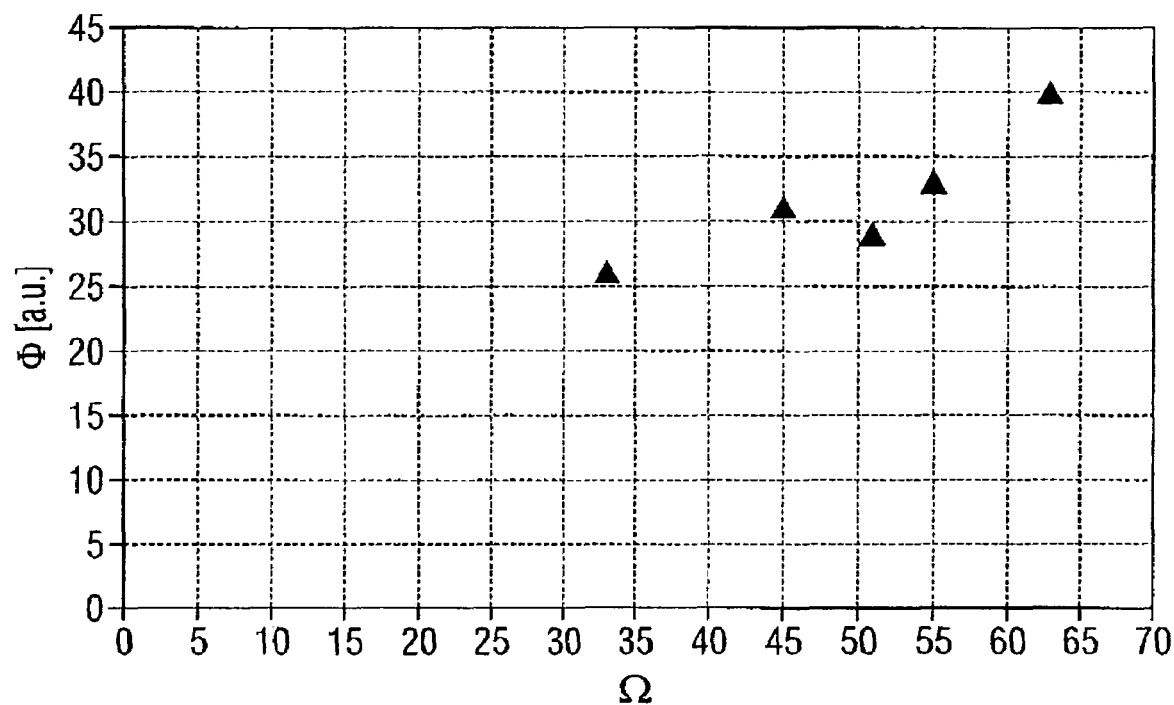

The graph shown in FIG. 3 plots the measured radiation yield Φ of various components as a function of a (in percent) of the corresponding component, where a:(1-a) denotes the ratio of Al to Ga in the outer layer. Apart from the value for a, the components on which the measurements have been performed are substantially identical and in each case correspond to a component in accordance with the exemplary embodiment explained with reference to FIGS. 1a and b. The outer layer 7 consists of $(Al_aGa_{1-a})_yIn_{1-y}P$, with y approximately 0.5. It is arranged on a current expansion layer, which likewise includes Al and Ga in the ratio a:(1-a).

Φ values for components with a between just below 0.35 and just below 0.65 are plotted. The radiation yield Φ increases as a rises, with Φ(a≈0.65) being approximately 50% higher than Φ(a≈0.35).

In addition to the measurements which are plotted in FIG. 3, it has also been observed that the electrical contact-making properties of outer layer 7 with a≈0.35 are relatively poor and initially improve as a rises from a≈0.4 upward, although the transverse conductivity of the outer layer 7 decreases slightly at the same time. "Transverse conductivity" means the conductivity in a direction parallel to the plane defined by the outer layer 7. This conductivity is called "transverse" to stress the difference from the vertical conductivity, i.e. the conductivity from top to bottom. The vertical conductivity also defines the main direction of the current path. However, the transverse conductivity is important for the so-called current spreading. The current spreading describes how the current injected at the bond pad is distributed laterally (i.e. "transverse"). A high transverse conductivity leads to a high current spreading and a uniform current distribution in lateral direction.

Depending on the electrical contact material, the contact-making properties deteriorate again as a increases beyond a certain value for a. Beyond a≈0.65, it appears increasingly difficult to produce an electrical contact region to the outer layer 7 with sufficiently good conductivity by means of Au:Ge, and this problem is exacerbated as the value of a continues to rise.

As has already been described in the general part of the description, very different values for a may be advantageous depending on how much importance is attached, for example, to the contact-making properties of the outer layer 7, the radiation yield or the transverse conductivity of the outer layer 7 in the specific component. This may in particular also depend on the materials used for the contact layer sequence 2 and on the process used to produce an electrically conductive contact to the outer layer 7. Accordingly, the value for a of approximately 0.55 which has been mentioned above in the exemplary embodiment described with reference to FIG. 1 does not in any way represent a value which is optimum for all situations in the context of the invention. Rather, it is to be understood as an example which may be particularly advantageous under certain aspects.

Of course, the description of the method and component based on the exemplary embodiments is not to be considered as restricting the invention to these embodiments in any way. By way of example, the epitaxial semiconductor layer sequence may be grown such that it ends with an n-conducting AlGaInP-based or AlGaInAs-based outer layer, so that this layer is exposed from the outset and electrical contact can be made with it directly. Moreover, the electrical contact material and/or the connection material do not have to be applied in the form of a layer. Rather, the electrical contact material may also be applied in any desired shape and may also be distributed over a plurality of non-cohesive regions. Also, it is by no means imperative that the connection material be applied to the entire surface of the electrical contact material, but rather it is sufficient if the materials are in contact with one another at one location, for example in a plane perpendicular to the outer layer, in such a manner that an electrical contact region of sufficiently good conductivity can be formed between them.

The invention encompasses every novel feature and every combination of features, in particular incorporating any combination of features in the patent claims, even if this combination is not specifically mentioned in the patent claims.

We claim:

1. A component having an electrical contact region, comprising:
    an epitaxial semiconductor layer sequence with an active zone which emits electromagnetic radiation, and an n-conducting AlGaInP-based or AlGaInAs-based outer layer, wherein said AlGaInP-based material comprises $Al_xGa_yIn_{1-x-y}P$ and wherein said AlGaInAs-based material comprises $Al_xGa_yIn_{1-x-y}As$, where 0<x<1, 0<y<1 and x+y<1; and
    an electrical contact region directly applied to said outer layer, wherein the electrical contact region comprises electrical contact material which includes Au and at least one dopant, the dopant containing at least one element selected from the group consisting of Ge, Si, Sn and Te.

2. The component as claimed in claim 1, in which the electrical contact region includes an electrical connection material.

3. The component as claimed in claim 1, in which the proportion of dopants in the electrical contact material is at most 5 percent by weight, preferably at most 3 percent by weight, particularly preferably between 0.1 and 1.5 percent by weight inclusive.

4. The component as claimed in claim 1, in which the electrical contact material is composed of a plurality of layers of material, at least one of which substantially consists of Au and at least another of which substantially consists of at least one dopant.

5. The component as claimed in claim 1, in which the electrical contact material includes at least one Au-dopant alloy in which the ratio of Au to dopant approximately corresponds to the eutectic composition of the alloy.

6. The component as claimed in claim 2, in which the electrical connection material, as seen from the outer layer, includes at least a first layer and a second layer, the first layer forming a diffusion barrier and the second layer forming an electrical connection surface.

7. The component as claimed in claim 6, in which the first layer includes at least one of the substances Ti, Pt, TiPt, TiW, TiN and TiW:N, and the second layer includes at least one of the substances Al and Au.

8. The component as claimed in claim 1, in which the electrical contact material is underlayed with a layer which includes at least one of the substances Ti, Cr, V and Ni and which has a thickness of between 0.1 nm and 100 nm, preferably between 1 and 20 nm, in each case inclusive of the limit values.

9. The component as claimed in claim 1, in which the outer layer is doped with at least one of the substances tellurium, silicon, selenium, sulfur, germanium and tin, with a concentration which is greater than or equal to $5 \cdot 10^{17}$ cm$^{-3}$ and is preferably greater than or equal to $8 \cdot 10^{17}$ cm$^{-3}$ and less than or equal to $5 \cdot 10^{19}$ cm$^{-3}$.

10. The component as claimed in claim 1, in which the epitaxial semiconductor layer sequence is a light-emitting diode layer sequence, in particular for a thin-film light-emitting diode.

11. The component as claimed in claim 1, in which the outer layer at least in part includes Al and Ga in a ratio a:(1-a), where $0.4 \leq a \leq 1$.

12. The component as claimed in claim 11, wherein $a \geq 0.45$.

13. The component as claimed in claim 11, wherein $a \geq 0.50$.

14. The component as claimed in claim 11, wherein $a \leq 0.65$.

15. The component as claimed in claim 11, wherein $a \leq 0.60$.

16. The component as claimed in claim 11, wherein the semiconductor layer sequence includes a current expansion layer which is arranged between the outer layer and the active zone and at least in part contains Al and Ga in a ratio b:(1-b), where $0.4 \leq b \leq 1$.

17. The component as claimed in claim 16, wherein $b \geq 0.45$.

18. The component as claimed in claim 16, wherein $b \geq 0.50$.

19. The component as claimed in claim 11, wherein the ratio of Al to Ga, at least in parts of the current expansion layer, substantially corresponds to a ratio of Al to Ga in parts of the outer layer.

* * * * *